United States Patent
Wang

(10) Patent No.: US 12,283,347 B2
(45) Date of Patent: *Apr. 22, 2025

(54) WORD LINE DRIVER AND MEMORY DEVICE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 258 days.

This patent is subject to a terminal disclaimer.

(21) Appl. No.: 17/936,823

(22) Filed: Sep. 29, 2022

(65) Prior Publication Data
US 2023/0026502 A1 Jan. 26, 2023

Related U.S. Application Data

(63) Continuation of application No. PCT/CN2022/104755, filed on Jul. 8, 2022.

(30) Foreign Application Priority Data

Jun. 24, 2022 (CN) .......................... 202210730432.2

(51) Int. Cl.
*G11C 8/08* (2006.01)
*G11C 11/408* (2006.01)

(52) U.S. Cl.
CPC ............ *G11C 8/08* (2013.01); *G11C 11/4085* (2013.01)

(58) Field of Classification Search
CPC ....... G11C 8/08; G11C 11/4085; G11C 5/025; G11C 8/14; H10B 12/488; H10B 12/50

USPC ...................................................... 365/230.06
See application file for complete search history.

(56) References Cited

U.S. PATENT DOCUMENTS

| | | |
|---|---|---|
| 6,222,789 B1 | 4/2001 | Cha |
| 10,008,256 B1 | 6/2018 | Kim |
| 2007/0035986 A1 | 2/2007 | Houston |
| 2007/0081405 A1* | 4/2007 | Yoo .......................... G11C 7/20 |
| | | 365/222 |
| 2008/0031060 A1 | 2/2008 | Choi |
| 2009/0103375 A1 | 4/2009 | Houston |
| 2021/0193213 A1 | 6/2021 | Jeong et al. |

(Continued)

FOREIGN PATENT DOCUMENTS

| | | |
|---|---|---|
| CN | 101119113 A | 2/2008 |
| CN | 101243518 A | 8/2008 |

(Continued)

*Primary Examiner* — Huan Hoang
(74) *Attorney, Agent, or Firm* — Syncoda LLC; Feng Ma

(57) ABSTRACT

A word line driver includes a PMOS area, a NMOS area, first gates, and second gates. The PMOS area includes first active areas extending along a first direction. The first active area includes a first channel area, a first source area and a first drain area. The NMOS area includes second active areas. The second active area includes a second channel area, a second source area, a second drain area, a third channel area, a third source area, and a third drain area. The extension direction of the first gate corresponding to the first active area is inclined compared with the first direction. The second gate covers the third channel area. The second gate, the third source area and the third drain area constitute a holding transistor.

20 Claims, 11 Drawing Sheets

(56) References Cited

U.S. PATENT DOCUMENTS

| | | |
|---|---|---|
| 2022/0068350 A1 | 3/2022 | Miyatake |
| 2022/0068351 A1 | 3/2022 | Shirako et al. |
| 2022/0093158 A1 | 3/2022 | Lee |
| 2022/0130460 A1 | 4/2022 | Yang |
| 2022/0157960 A1 | 5/2022 | Cho et al. |

FOREIGN PATENT DOCUMENTS

| | | |
|---|---|---|
| CN | 113012734 A | 6/2021 |
| CN | 114496019 A | 5/2022 |
| CN | 114512486 A | 5/2022 |
| KR | 20010055932 A | 7/2001 |

* cited by examiner

WORD LINE DRIVER AND MEMORY DEVICE

CROSS-REFERENCE TO RELATED APPLICATIONS

This is a continuation of International Patent Application No. PCT/CN2022/104755 filed on Jul. 8, 2022, which claims priority to Chinese Patent Application No. 202210730432.2 filed on Jun. 24, 2022. The disclosures of the above-referenced applications are hereby incorporated by reference in their entirety.

BACKGROUND

Memory is a common semiconductor structure. With the continuous decrease of semiconductor structure size, more memories can be integrated into the chip, which contributes to the increase of product capacity. In a dynamic random access memory (DRAM), it is necessary to write/read data to/from memory cells by using word lines and bit lines and operate on the basis of a voltage applied to the word lines.

As the DRAM capacity increases, the number of memory cells connected to one word line increases, the distance between the word lines decreases, and a speed delay problem may occur. In order to improve the delay of the word line voltage, one word line can be divided into a plurality of sub word-lines and each sub word-line can be driven by using a sub word-line driver (SWD).

However, the current word line drivers have the problems of large layout area and poor driving ability.

SUMMARY

The embodiments of the present disclosure relate to the field of semiconductor technology, in particular to a word line driver and a memory device.

The embodiments of the present disclosure provide a word line driver. The word line driver includes a substrate, first gates and a plurality of second gates. The substrate includes an NMOS (N-Metal-Oxide-Semiconductor) area and a PMOS (P-Metal-Oxide-Semiconductor) area. The PMOS area includes a plurality of first active areas extending along a first direction, and each first active area includes a first channel area, and a first source area and a first drain area respectively located on opposite sides of the first channel area. The NMOS area and the PMOS area are arranged along a second direction. The NMOS area includes a plurality of second active areas extending along the first direction, and each second active area includes a second channel area, and a second source area and a second drain area respectively located on opposite sides of the second channel area. The each second active area further includes a third channel area, and a third source area and a third drain area respectively located on opposite sides of the third channel area. The first gates are electrically connected to a main word line. A first gate, a first source area and a first drain area constitute a pull-up transistor. A first gate, a second source area and a second drain area constitute a pull-down transistor. The pull-up transistor and the pull-down transistor are electrically connected to a same sub word-line, and an extension direction of first gates corresponding to a first active area are inclined compared with the first direction. Each second gate covers a corresponding third channel area, and a second gate, a third source area and a third drain area constitute a holding transistor. For a same holding transistor, a third drain area is electrically connected to a second drain area of a pull-down transistor, and a third source area is electrically connected to a second drain area of another pull-down transistor.

Accordingly, the embodiments of the present disclosure also provide a memory device. The memory device includes a memory cell array and a word line driver provided by any of the above embodiment. A memory cell array includes a plurality of memory cells connected to a plurality of sub word-lines and a plurality of bit lines.

BRIEF DESCRIPTION OF THE DRAWINGS

One or more embodiments are exemplarily described by the pictures in the corresponding appended drawings. These exemplary descriptions do not constitute a limitation on the embodiments. The figures in the drawings do not constitute a limitation of scale unless specifically stated. To more clearly explain the embodiments of the present disclosure or the technical solution in the conventional technique, the drawings needed to be used in the embodiments will be briefly described below. Obviously, the drawings described below are only some embodiments of the present disclosure, and other drawings can be obtained from these drawings without creative effort for an ordinary skilled person in the art.

DETAILED DESCRIPTION

Figure 1:
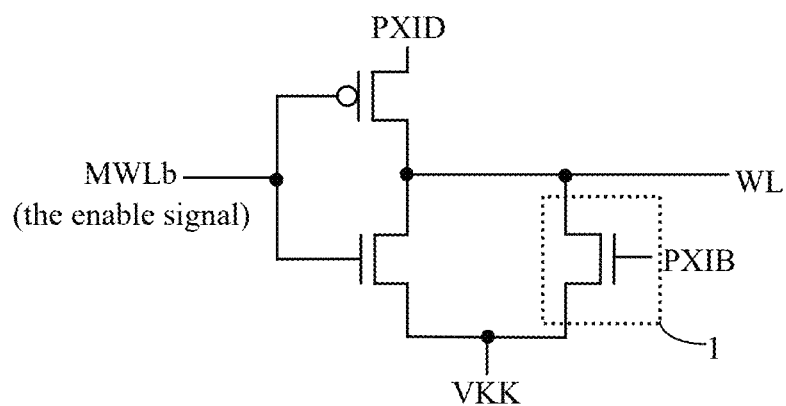
FIG. 1 is a circuit diagram of a word line driving circuit.
Figure 2:
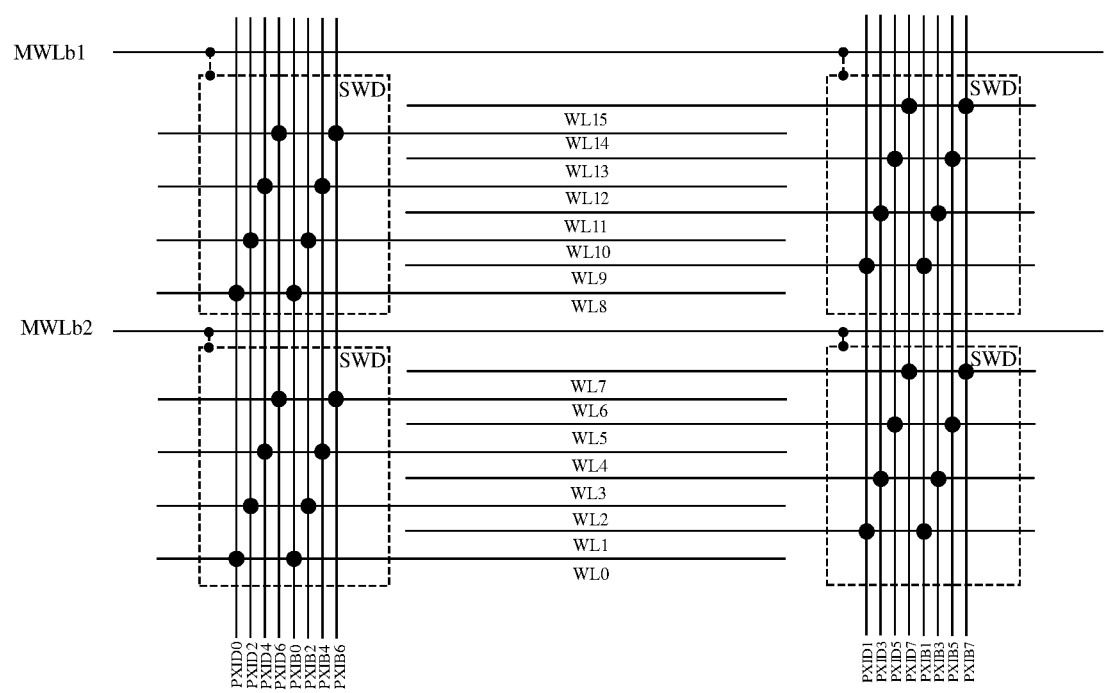
FIG. 2 is an architecture diagram of a sub word-line system.

It can be seen from the background technology that the current word line driver has the problems of large layout area and poor driving ability. Through analysis, one of the reasons for the large layout area of the current word line driving circuit is that, referring to FIG. 1 and FIG. 2, currently, the word line driving circuit includes at least one sub word-line driver, and the sub word-line driver is connected to a main word line MWLb and a sub word-line WL. The sub word-line driver further includes a holding transistor. A first end of the holding transistor 1 is connected to the sub word-line WL, and the other end of the holding transistor 1 is coupled to the low level VKK. The sub word-line driver receives an enable signal provided by MWLb and a driving signal PXID, and supplies the driving signal PXID to the sub word-line WL to drive the sub word-line WL. When the sub word-line WL is not needed to be selected, the first end and the second end of the holding transistor can be conductive in response to the enable signal, the driving signal PXID, and the driving signal PXIB, so that the first end of the holding transistor 1 is coupled to the low level VKK, and further the sub word-line WL connected to the first end of the holding transistor 1 is also pulled low to the low level VKK to close the sub word-line WL. That is, one holding transistor is only used to control one sub word-line so that the sub word-line remains in an unselected state. As can be seen from FIG. 2, when two main word lines (denoted as MWLb1 and MWLb2 respectively) are included in the word line driving circuit, each main word line corresponds to two sub word-line drivers SWD respectively, each holding transistor is electrically connected to one sub word-line (a plurality of sub word-lines are denoted as WL0 to WL15 in the figure), so that the sub word-line drivers are respectively responsive to the corresponding driving signal PXIB and the corresponding driving signal PXID to control the closing of the sub word-lines, which occupies more space in the word line driving circuit layout.

In addition, when the layout area of the word line driver is decreased, it is likely that the overall size of the pull-up transistors, the pull-down transistors, or the holding transistors is reduced, so that the channel area of the pull-up transistor, the pull-down transistor, or the holding transistor is decreased, thereby reducing the driving capability of the word line driver.

In the technical solution of the word line driver provided by the embodiments of the present disclosure, the word line driver includes a plurality first active area. Each first active area includes a first channel area, a first source area and a first drain area. The first gates are electrically connected to a main word line. A first gate, a first source area and a first drain area constitute a pull-up transistor. A first gate, a second source area and a second drain area constitute a pull-down transistor. The pull-up transistor and the pull-down transistor are electrically connected to a same sub word-line, so that the pull-up transistor and the pull-down transistor can respectively transmit a driving signal to the sub word-line through the first drain area, thereby controlling the driving and closing of the sub word-line. The word line driver further includes a plurality of second gates. A second gate covers a third channel area. A second gate, a third source area and a third drain area form a holding transistor. A third drain area and a third source area of the holding transistor are electrically connected to the second drain areas of two different pull-down transistors. That is, two pull-down transistors share a same holding transistor. In this way, when a sub word-line connected to a pull-down transistor is driven, the holding transistor can control the sub word-line connected to the other pull-down transistor to be in an unselected state at the same time to decrease the area occupied by the holding transistor in a case of maintaining the performance of the word line driver unchanged, thereby decreasing the layout area of the word line driver. In addition, the extension direction of the first gates corresponding to a first active area is set to be inclined compared with the extension direction of the first active areas, so that the first gates in the first active area have a larger size, which is equivalent to increasing the channel size of the pull-up transistor, thereby improving the driving ability of the first gate to the pull-up transistor.

Embodiments of the present disclosure provide a word line driver. The word line driver includes a plurality of first active area. Each first active area includes a first channel area, a first source area and a first drain area. A first gate, a first source area and a first drain area constitute a pull-up transistor. The first drain area of the pull-up transistor is electrically connected to the second drain area of the pull-down transistor, and is electrically connected to the corresponding sub word-line, so that the pull-up transistor and the pull-down transistor can respectively transmit a driving signal to the sub word-line through the first drain area and the second drain area, thereby controlling the driving and closing of the sub word-line. A third drain area and a third source area of the holding transistor are set to electrically connect to the second drain areas of two different pull-down transistors. That is, two pull-down transistors share a same holding transistor. In this way, when a sub word-line connected to a pull-down transistor is driven, the holding transistor can control the sub word-line connected to the other pull-down transistor to be in an unselected state at the same time to decrease the area occupied by the holding transistor in a case of maintaining the performance of the word line driver unchanged, thereby decreasing the layout area of the word line driver. In addition, the extension direction of the first gates corresponding to a first active area is set to be inclined compared with the extension direction of the first active areas, so that the first gates in the first active area have a larger size, which is equivalent to increasing the channel size of the pull-up transistor, thereby improving the driving ability of the first gate to the pull-up transistor.

Embodiments of the present disclosure will be described in detail below with reference to the accompanying drawings. However, those of ordinary skill in the art will understood that in various embodiments of the present disclosure, numerous technical details have been presented in order to enable the reader to better understand the present disclosure. However, even without these technical details and various variations and modifications based on the following embodiments, the claimed technical solutions of the present disclosure may be implemented.

Figure 3:
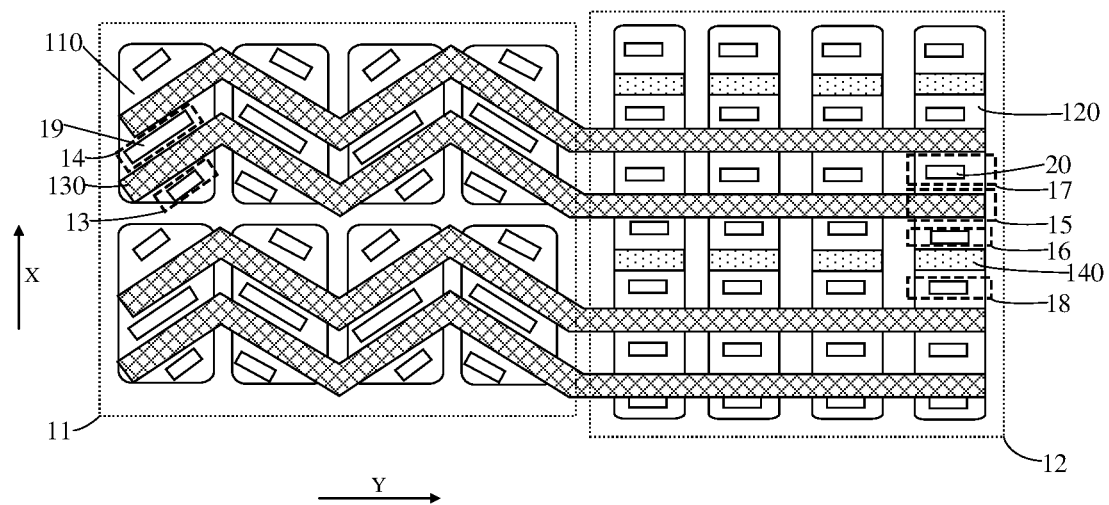
FIG. 3 is a schematic diagram of a layout structure of a first word line driver provided by the embodiments of the present disclosure.
Figure 4:
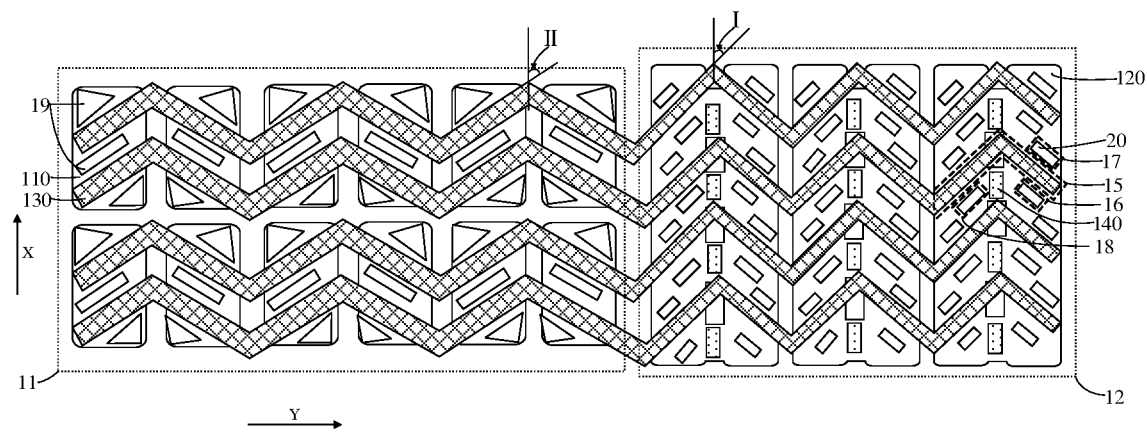
FIG. 4 is a schematic diagram of a layout structure of a second word line driver provided by the embodiments of the present disclosure.

FIG. 3 is a schematic diagram of the layout structure of the first word line driver provided by the embodiments of the present disclosure. FIG. 4 is a schematic diagram of the layout structure of the second word line driver provided by the embodiments of the present disclosure.

Referring to FIG. 3, the word line driver includes a substrate, first gates 130 and a plurality of second gates 140. The substrate includes an NMOS (N-Metal-Oxide-Semiconductor) area 12 and a PMOS (P-Metal-Oxide-Semiconductor) area 11. The PMOS area 11 includes a plurality of first active areas 110 extending along a first direction X, and each first active area 110 includes a first channel area, and a first source area 14 and a first drain area 13 respectively located on opposite sides of the first channel area. The NMOS area 12 and the PMOS area 11 are arranged along a second direction Y. The NMOS area 12 includes a plurality of second active areas 120 extending along the first direction X, and each second active area 120 includes a second channel area 15, and a second source area 17 and a second drain area 16 respectively located on opposite sides of the second channel area 15. Each second active area 120 further includes a third channel area, and a third source area 18 and a third drain area respectively located on opposite sides of the third channel area. The first gates 130 are electrically connected to a main word line. A first gate 130, a first source area 14 and a first drain area 13 constitute a pull-up transistor. A first gate 130, a second source area 17 and a second drain area 16 constitute a pull-down transistor. The pull-up transistor and the pull-down transistor are electrically connected to a same sub word-line, and an extension direction of first gates 130 corresponding to a first active area 110 are inclined compared with the first direction X. Each second gate 140 covers a corresponding third channel area, and a second gate 140, a third source area 18 and a third drain area constitute a holding transistor. For a same holding transistor, a third drain area is electrically connected to a second drain area 16 of a pull-down transistor, and a third source area 18 is electrically connected to a second drain area 16 of another pull-down transistor.

The pull-up transistor and the pull-down transistor are electrically connected to the sub word-line, so that driving and closing of the sub word-line can be controlled. Specifically, in some embodiments, each first gate 130 extends along a second direction Y and covers a plurality of first channel areas and a plurality of second channel areas 15. A first drain area of a pull-up transistor is electrically connected to a second drain area of a pull-down transistor and is electrically connected to a corresponding sub word-line. That is to say, a same sub word-line is electrically connected to a first drain area of a pull-up transistor and a second drain area of a pull-down transistor at the same time, so that the pull-up transistor may transmit a driving signal to the sub word-line through the first drain area to drive the sub word-line, and the pull-down transistor may transmit the driving signal to the sub word-line through the second drain area to close the sub word-line.

A third drain area and a third source area 18 of a holding transistor are set to electrically connect to second drain areas 16 of two different pull-down transistors, so that two pull-down transistors share a same holding transistor. In this way, when a sub word-line connected to one of the two pull-down transistors is driven, the holding transistor can control the sub word-line connected to the other pull-down transistor to be in an unselected state at the same time to decrease the layout area of the word line driver in a case of maintaining the performance of the word line driver unchanged. In addition, the extension direction of the first gates 130 corresponding to a first active area 110 is set to be inclined compared with the extension direction of the first active areas 110, so that the first gates 130 in the first active area 110 have a larger size, which is equivalent to increasing the channel size of the pull-up transistor, thereby improving the driving ability of the first gate 130 to the pull-up transistor.

In some embodiments, the material of the substrate is a semiconductor material. Specifically, in some embodiments, the material of the substrate is silicon. In other embodiments, the substrate may be a germanium substrate, a silicon germanium substrate, a silicon carbide substrate, or a silicon substrate on an insulator.

The PMOS area 11 is used for forming PMOS transistors, and the pull-up transistor is located in the PMOS area 11. That is, the pull-up transistor is a PMOS transistor. The NMOS area 12 is used for forming NMOS transistors, and the pull-down transistor is located in the NMOS area 12, such that the pull-down transistor is an NMOS transistor. The first drain area 13 is used for forming the drain of the pull-up transistor, and the second drain area 16 is used for forming the drain of the pull-down transistor. The first drain area 13 of the pull-up transistor is electrically connected to the second drain area 16 of the pull-down transistor, and the first drain area 13 and the second drain area 16 are also electrically connected to a sub word-line, respectively. Thus, a driving signal for driving the sub word-line may be transmitted through the source of the pull-up transistor to the drain of the pull-up transistor and be input to the sub word-line to control the driving of the sub word-line. A driving signal for closing the sub word-line may be transmitted through the source of the pull-down transistor to the drain of the pull-down transistor and be input to the sub word-line to control the closing of the sub word-line. Moreover, since the pull-up transistor and the pull-down transistor are different types of transistors, the pull-down transistor is closed when the pull-up transistor is conductive, so that the pull-up transistor may be used to drive sub word-line, and the pull-up transistor is closed when the pull-down transistor is conductive, so that the pull-down transistor may be used to close the sub word-line. That is, the pull-up transistor and the pull-down transistor may be used to drive and close the sub word-line, respectively.

It should be understood that a pull-up transistor and a pull-down transistor may be used to form a sub word-line driver 100 for driving and closing a sub word-line. Since the pull-up transistor and the pull-down transistor are different types of transistors, and the pull-up transistor is located in the PMOS area 11 and the pull-down transistor is located in the NMOS area 12, in some embodiments, the sub word-line driver 100 further includes a metal layer for electrically connecting the first drain area 13 of the pull-up transistor and the second drain area 16 of the pull-down transistor. Specifically, in some embodiments, the metal layer and the first drain area 13 may be electrically connected by a conductive plug, and the metal layer and the second drain area 16 also may be electrically connected by a conductive plug.

The first gates 130 may serve as a main word line, and serve as gates of a plurality of pull-up transistors and a plurality of pull-down transistors at the same time, so that a plurality of pull-up transistors and a plurality of pull-down transistors may drive a plurality of sub word-line in response to an enable signal provided by the first gates 130.

The third drain area is used as the drain of the holding transistor, the third source area 18 is used as the source of the holding transistor, and the third source area 18 and the third drain area of the same holding transistor are respectively electrically connected to the second drain areas 16 of two different pull-down transistors. That is, the source and drain of the same holding transistor are respectively connected to the drains of two different pull-down transistors. Since the drains of the two different pull-down transistors are further connected to two different sub word-lines, the source and drain of the same holding transistor are further electrically connected to the two different sub word-lines, so that one holding transistor may have a function of keeping the voltage of the two different sub word-lines stable. That's because the word line driver can drive only one sub word-line at the same time. For example, if the number of sub word-lines is 2, when one of the sub word-lines connected to the holding transistor is selected, the other sub word-line is in an unselected state. When the selected sub word-line needs to be closed, the source and drain of the holding transistor are conductive, so that the level of the selected sub word-line is pulled to be coincided with the level of the unselected sub word-line, thereby ensuring that the selected sub word-line may be completely closed.

Compared with a holding transistor for controlling one sub word-line, in the embodiments of the present disclosure, the source and drain of a holding transistor are respectively electrically connected to two sub word-lines, thereby being used for controlling the two sub word-lines, thereby greatly decreasing the number of holding transistors in a word line driver and further decreasing the layout area of the word line driver.

An extension direction of the first gates 130 corresponding to a first active area 110 is set to be inclined compared with the first direction X. That is, the extension direction of the first gates 130 corresponding to a first active area 110 is inclined compared with the extension direction of the first active areas 110. Comparing with the first gates 130 extending perpendicularly to the extension direction of the first active areas 110, the length of the first gate 130 is greater, so that the size of the first gate 130 may be increased. In this way, the contact area between the first gate 130 and the channel area is increased, so that the channel size of the formed pull-up transistor is increased, so that the driving and controlling ability of the first gate 130 to the pull-up transistor can be improved. Thus, the driving capability of the word line driver is increased while decreasing the layout area of the word line driver.

Referring to FIG. 3, in some embodiments, the word line driver further includes first contact structures 19. Each first contact structure is electrically connected to the first source area 14 or the first drain area 13. Extension directions of orthographic projections, of at least a part number of the first contact structures 19, on a surface of the substrate are inclined compared with the first direction X. The first contact structure 19 is electrically connected to the first source area 14 or the first drain area 13, so that the first contact structure 19 may provide an external electrical signal to the pull-up transistor. On the other hand, it may also be used to draw out the electrical signal of the pull-up transistor. Compared with setting the extension direction of orthographic projection, of the first contact structure 19, on a surface of the substrate to be perpendicular to the first direction X (that is, perpendicular to the extension direction of the first active areas 110), the first contact structure 19 is set to be inclined compared with the extension direction of the first active areas 110, so that the length of the first contact structure 19 in the extension direction is increased, thereby increasing the size of the first contact structure 19, facilitating the decreasing of the resistance of the first contact structure 19, increasing the speed for transmitting the electrical signal by the first contact structure 19, further increasing the starting speed of the pull-up transistor, and further improving the driving capability of the pull-up transistor to the sub word-line.

The extension direction of the first contact structures 19 may be the same as the extension direction of the first gates 130 corresponding to the first active areas 110, so that the first contact structures 19 and the first gates 130 may be prevented from having a problem of crossing lines.

In some embodiments, the material of the first contact structure 19 may be any one of copper, aluminum or tungsten.

Referring to FIG. 4, in some embodiments, an orthographic projection, of a first contact structure 19 near an edge of a first active area 110, on the surface of substrate is triangular. An extension direction of an orthographic projection, of a boundary of the first contact structure 19, on the substrate surface is inclined compared with the first direction X, the boundary towards a first gate 130. Herein, the edge position of the first active area 110 refers to the edge position of the first active area 110 in the first direction X. In some embodiments, the shape of the first active area 110 is rectangular. When the first gates 130 of the first active area 110 are inclined compared with the extension direction of the first active areas 110, the edge position of the first active area 110 has more free space, and the first gate 130 and edges of the first active area 110 form a triangular area. Based on this, the orthographic projection, of the first contact structure 19 near the edge of the first active area 110, on the surface of the substrate is set to be triangular, so that the shape of the first contact structure 19 is adapted to the shape of the triangular area. The free space of the first active area 110 may be fully utilized, so that the size of the first contact structure 19 reaches a larger level in the available space, thereby decreasing the resistance of the first contact structure 19, thereby further increasing the speed for transmitting the electrical signal by the first contact structure 19 and improving the driving capability of the pull-up transistor to the sub word-line.

It should be understood that the first contact structure 19 located between two adjacent first gates 130 may be rectangular, and the extension direction of the first contact structures 19 is the same as that of the first gates 130, so that the first contact structures 19 and the first gates 130 may be prevented from having a problem of crossing lines.

With continued reference to FIG. 4, in some embodiments, the extension direction of the first gates 130 corresponding to a second active area 120 is inclined compared with the first direction X. That is, the extension direction of the first gates 130 corresponding to a second active area 120 is inclined compared with the extension direction of the second active areas 120. While the extension direction of the first gates 130 corresponding to a first active area 110 is inclined compared with the extension direction of the first active areas 110, the extension direction of the first gates 130 of a second active area 120 is set to be inclined compared with the direction of the second active areas 120, so that the length of the first gate 130 of the second active area 120 is also greater, thereby increasing the length of the first gate 130 of the second active area 120. Since the first gate 130 of the second active area 120 is used to form the pull-down transistor, the channel size of the formed pull-down transistor is correspondingly increased, the driving capability and the control capability of the first gate 130 to the pull-down transistor are improved, and the speed of closing the sub word-line by word line driver is increased.

The first active area 110 is located in the PMOS area 11 and is used for forming a pull-up transistor, and the second active area 120 is located in the NMOS area 12 and is used for forming a pull-down transistor and a holding transistor. The number of pull-up transistors is the same as the number of pull-down transistors, and the number of the holding transistors is half of the number of pull-down transistors. That is, the number of transistors formed in the second active area 120 is greater than the number of transistors formed in the first active area 110. That is, the number of holding transistors is additional. Thus, compared with the first active area 110, third channel area needs to be formed in the second active area 120. In order to provide more space for forming the third channel area, in some embodiments, the length of the second active area 120 is longer than the length of the first active area 110 in the first direction X, such that the second active area 120 may form a plurality of second channel areas 15 and a plurality of third channel area in the first direction X, thereby forming a plurality of pull-down transistors and a plurality of holding transistors.

Referring to FIG. 4, in some embodiments, an inclined angle between an extending direction of the first gates 130 corresponding to a second active area 120 and the first direction X is a first angle I, and an inclined angle between an extending direction of first gates 130 corresponding to a first active area 110 and the first direction X is a second angle II, and the first angle I is less than the second angle II. Since the length of the second active area 120 is longer than the length of the first active area 110 in the first direction X, it is necessary to set the overall size of the second active area 120 not to be too great in order to keep the overall size of the sub word-line driver less. Therefore, it is necessary to set the width of the second active area 120 less in the second direction Y. It should be understood that when the width of the second active area 120 in the second direction Y is constant, the less the inclined angle between an extending direction of the first gates 130 corresponding to the second active area 120 and the first direction X is, that is, the less the first angle is, the extension direction of the first gates 130 is closer to being parallel to the first direction X, so that the length of the first gate 130 will be greater, thereby increasing the size of the first gate 130 and increasing the driving capability for the pull-down transistor. Therefore, the first angle is set to be less than the second angle, so that the difference between the size of the first gate 130 corresponding to the second active area 120 and the size of the first gate 130 corresponding to the first active area 110 is not too great, so that the driving ability of the first gate 130 to both the pull-up transistor and the pull-down transistor is strong.

In addition, when the first gate 130 is used to form a plurality of pull-down transistors, the number of second channel areas 15 covered by the first gate 130 in the second active area 120 is great, and the plurality of second channel areas 15 are arranged at intervals in the second direction Y. Based on this, when the first gate 130 in the second active area 120 needs to cover a plurality of second channel areas 15, the first gates 130 corresponding to two adjacent second channel areas 15 are connected and have an included angle with each other. Since the width of the second active area 120 in the second direction Y is less, the angle between the first gates 130 corresponding to the two adjacent second channel areas 15 is less. Thus, an inclined angle between an extending direction of the first gates 130 corresponding to the second active area 120 and the first direction X is less, that is, the first angle is less, which is beneficial to adapting to the second active area 120 with a less size, and improving the driving capability of the word line driver under the condition of decreasing the layout area of the word line driver.

In some embodiments, the word line driver further includes second contact structures 20. Each second contact structure is used to electrically connect to a second source area 17, a second drain area 16, a third source area 18 or a third drain area. An extension direction of an orthographic projection, of the second contact structure 20, on a surface of the substrate is inclined compared with the first direction X. The second contact structure 20 is electrically connected to the second source area 17, the second drain area 16, the third source area 18 or the third drain area, so that the second contact structure 20 may provide an external electrical signal to the pull-down transistor and the holding transistor. Comparing with setting the second contact structure 20 to be perpendicular to the direction of extension of the second active areas 120, the second contact structure 20 is set to be inclined compared with an extension direction of the second active areas 120, so that the length of the second contact structure 20 in the extension direction is increased, thereby increasing the size of the second contact structure 20, facilitating the decreasing of the resistance of the second contact structure 19, speeding up the speed for transmitting the electrical signal by the second contact structure 20, further increasing the starting speeds of the pull-down transistor and the holding transistor, and improving the closing speed to the sub word-line by the word line driver.

The extension direction of the second contact structures 20 may be the same as the extension direction of the first gates 130 corresponding to a second active area 120, so that the second contact structures and the first gates 130 in the second active areas 120 may be prevented from having a problem of crossing lines.

In some embodiments, the material of the second contact structure 20 may be the same as the material of the first contact structure 19, so that the first contact structure 19 and the second contact structure 20 may be formed simultaneously in the same process step, which is beneficial to save process flow.

Figure 5:
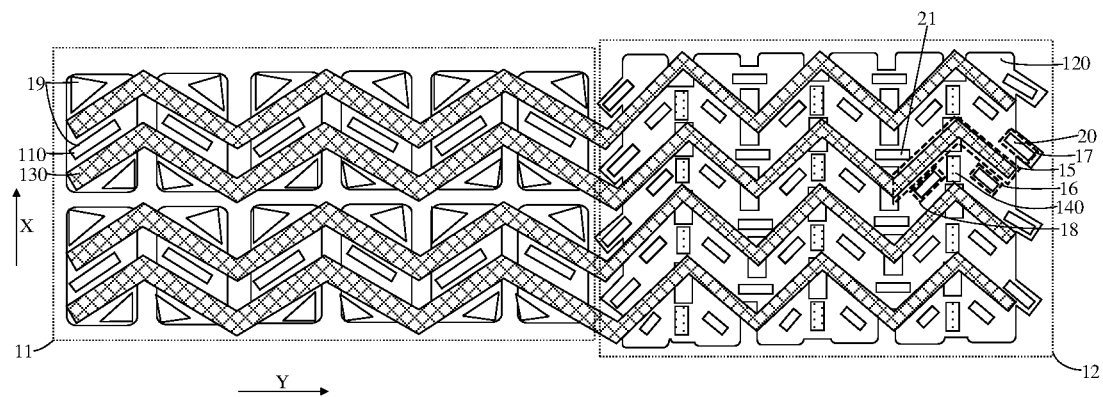
FIG. 5 is a schematic diagram of a layout structure of a third word line driver provided by the embodiments of the present disclosure.

Referring to FIG. 5, in some embodiments, partial area of the orthographic projection, of the second contact structure 20, on the surface of the substrate is located outside of a second active area 120. That is, the second contact structure 20 extends to the outside of the second active area 120. Compared with the fact that the second contact structure 20 is only located inside of the second active area 120, the length size of the second contact structure 20 in the extension direction is increased, thereby increasing the volume of the second contact structure 20, which is beneficial to decreasing the resistance of the second contact structure 20 and increasing the transmission speed of the second contact structure 20 for electrical signals.

In some embodiments, the second active area 120 where the second contact structure 20 is located may also extend outward, and the second contact structure 20 is located on the second active area 120 that is outward extended, so that the contact area between the second contact structure 20 and the second source area 17, the second drain area 16, the third source area 18 or the third drain area is increased, the contact resistance is decreased, and the signal delay is reduced.

In some embodiments, the word line driver further includes third contact structures 21. Each third contact structure 21 is used to electrically connect to adjacent second active areas. The third contact structure 21 is located between two adjacent second active areas 120, and may be used to electrically connect to the second source area 17 and to electrically connect to the ground, so that a low-level driving signal is provided to the pull-down transistor to close the sub word-line. The third contact structure 21 is set to electrically connect the adjacent second active areas 120, that is, two pull-down transistors of the adjacent two second active areas 120 may share the same third contact structure 21, so that the occupied area of the third contact structure 21 may be decreased and the layout area may be decreased. In addition, since the third contact structure 21 spans the distance between the two second active areas 120, the size of the third contact structure 21 is great. Thus, the resistance of the third contact structure 21 may be less, so that the transmission speed of the third contact structure 21 for the electrical signal is fast. That is, a strong driving capability of the pull-down transistor is kept while decreasing the layout area of the second active area 120.

Referring to FIG. 3-FIG. 5, in some embodiments, the PMOS area 11 may be located on one side of the NMOS area 12. The first drain area 13 in the PMOS area 11 corresponds to the second drain area 16 in the NMOS area 12. That is, each first drain area 13 in the PMOS area 11 is electrically connected to each second drain area 16 in the NMOS area 12, so that the drain of one pull-up transistor is electrically connected to the drain of the other pull-down transistor. Only one PMOS area 11 and one NMOS area 12 are set, and are used for forming pull-up transistors, pull-down transistors and holding transistors. Thus, when the pull-up transistors, the pull-down transistors and the holding transistors are manufactured in practice, the substrate in the same area may be doped to form the first active areas 110 and the second active areas 120, and the pull-down transistors and the holding transistors may be formed in the same step, which is beneficial to simplifying the manufacturing process.

Figure 6:
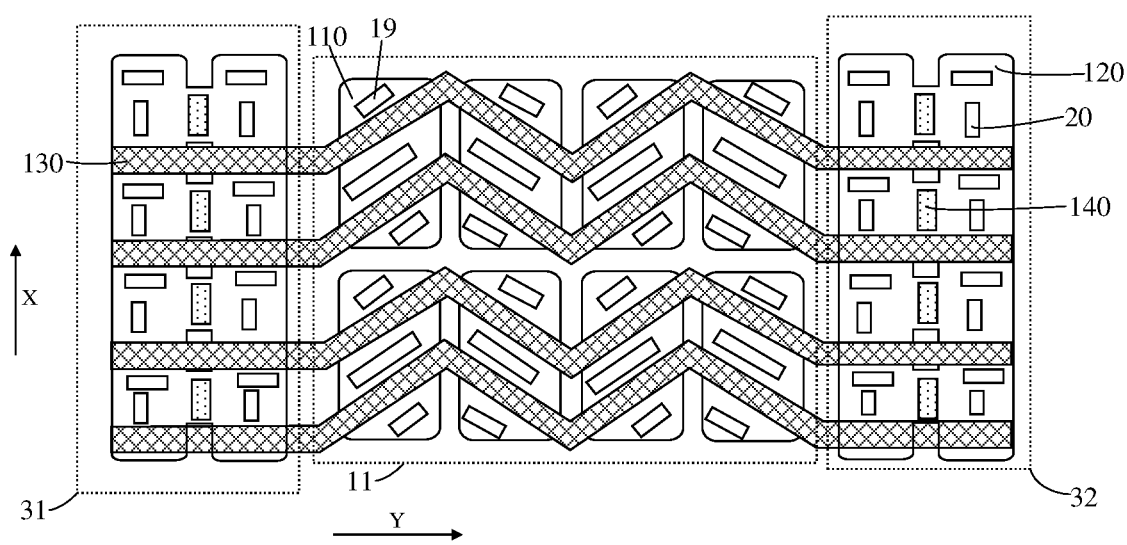
FIG. 6 is a schematic diagram of a layout structure of a fourth word line driver provided by the embodiments of the present disclosure.
Figure 7:
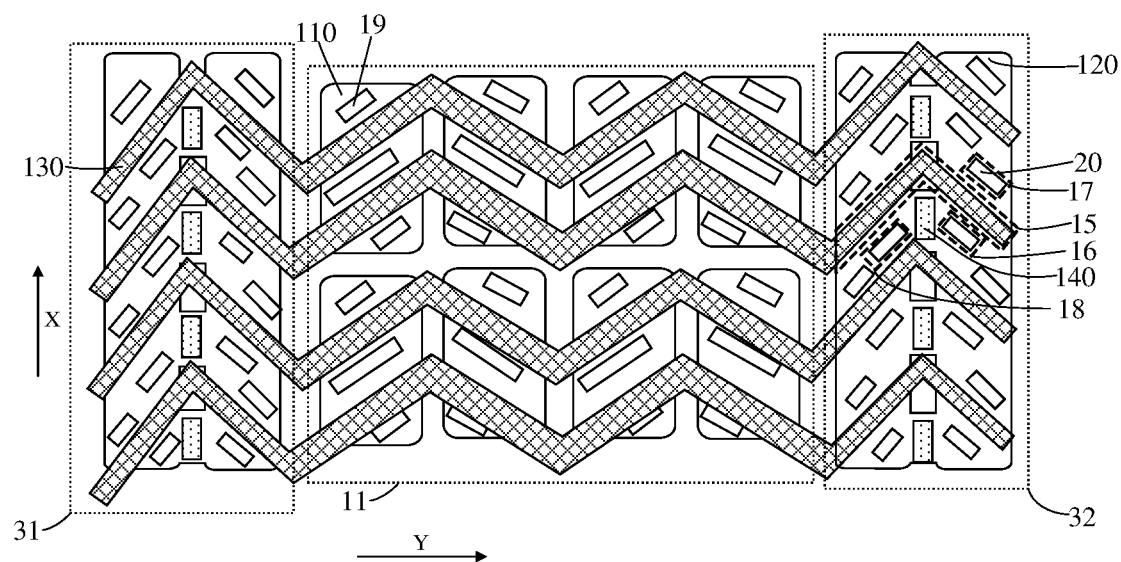
FIG. 7 is a schematic diagram of a layout structure of a fifth word line driver provided by the embodiments of the present disclosure.

Referring to FIG. 6 and FIG. 7, in other embodiments, the NMOS area 12 may include a first NMOS area 31 and a second NMOS area 32 respectively located on opposite sides of the PMOS area 11. A part number of pull-down transistors are located in the first NMOS area 31 and the remaining part number of pull-down transistors is located in the second NMOS area 32. Considering the complexity of layout design, the NMOS area 12 is divided into a first NMOS area 31 and a second NMOS area 32, thereby flexibly adjusting the layout position of the NMOS area 12, which is beneficial to improving the rationality of layout.

In some embodiments, referring to FIG. 6, when the NMOS area 12 includes the first NMOS area 31 and the second NMOS area 32 located on opposite sides of the PMOS area 11, only the extension direction of the first gates 130 corresponding to the first active areas 110 in the PMOS area 11 may be inclined compared with the first direction X, and the extension direction of the first gates 130 corresponding to the second active areas 120 in the first NMOS area 31 and the second NMOS area 32 is perpendicular to the first direction X.

In other embodiments, referring to FIG. 7, when the NMOS area 12 includes the first NMOS area 31 and the second NMOS area 32 located on opposite sides of the PMOS area 11, the extension directions of the first gates 130 in the PMOS area 11 and the first gates 130 in the first NMOS area 31 and the second NMOS area 32 may be inclined compared with the first direction X, thereby greatly increasing the overall size of the first gate 130.

With continued reference to FIG. 3, in some embodiments, a second drain area 16 of a pull-down transistor corresponding to a first gate 130 and a third drain area of a holding transistor are shared, and a second drain area 16 of a pull-down transistor corresponding to another first gate 130 and a third source area 18 of the same holding transistor are shared. That is, the second gate 140 is located on the surface of the third channel area, and forms a holding transistor with a second drain area 16 of the pull-down transistor and a second drain area 16 of the other pull-down transistor. Thus, the area of the second active area 120 may be decreased, thereby decreasing the layout area of the word line driver.

Specifically, in some embodiments, the second gate 140 is located between adjacent first gates 130. That is, the third channel area is located on one side of the second source area 17 or the second drain area 16 along the first direction X. Since the second gate 140 is located between two adjacent first gates 130, and the first gates 130 on two sides of the second gate 140 are respectively used to form two different pull-down transistors, so that the holding transistor is electrically connected to the pull-down transistors corresponding to the two different first gates 130 respectively. The second drain area 16 on one side of the third channel area may be used as a drain of a pull-down transistor corresponding to a first gate 130, and the second drain area 16 on the other side of the third channel area may be used as a drain of a pull-down transistor corresponding to another first gate 130. In some embodiments, two adjacent pull-down transistors corresponding to the same first gate 130 may also share the second source area 17, thereby further decreasing the layout area of the word line driver.

Figure 8:
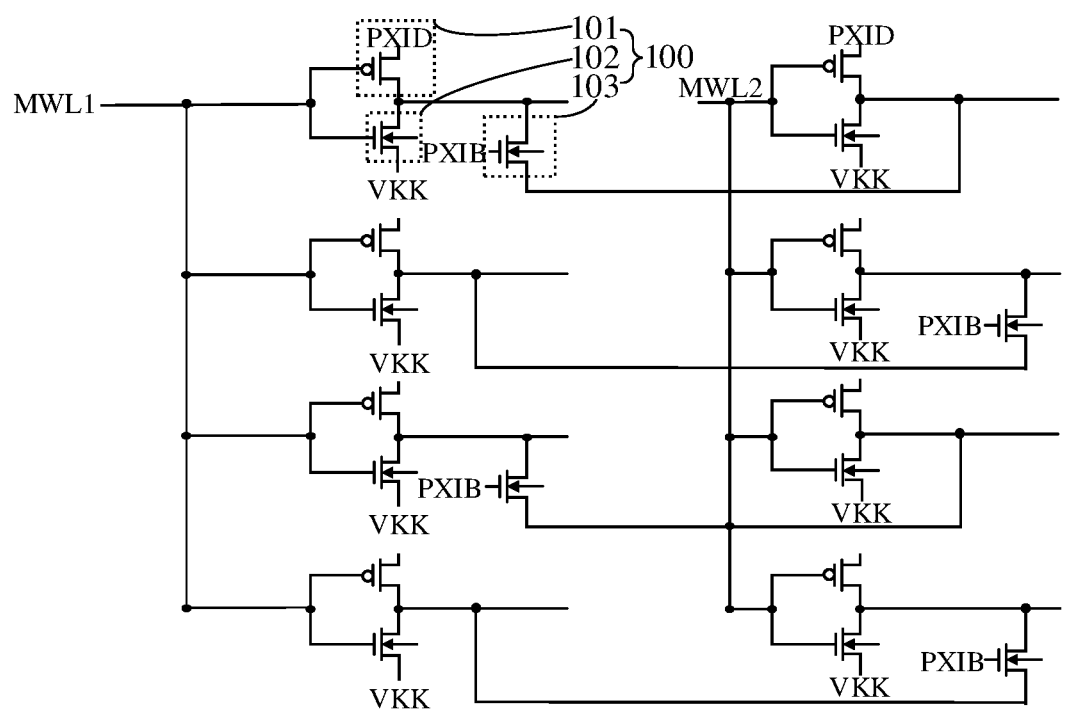
FIG. 8 is a schematic diagram of a circuit structure corresponding to the first word line driver provided by the embodiments of the present disclosure.

Specifically, the reference of the word line driving circuit corresponding to the word line driver in FIG. 3 is made to FIG. 8. The word line driving circuit includes at least two sub word-line drivers 100. Each sub word-line driver is connected to a main word line and a sub word-line, and the main word line is used for providing an enable signal. The first end and the second end of the holding transistor 103 are respectively connected to different sub word-lines. The two sub word-lines connected to the first end and the second end of the holding transistor 103 correspond to different main word lines, respectively. The gate of the holding transistor 103 receives the second driving signal PXIB. The gate of the pull-up transistor 101 is connected to the main word line. The source of the pull-up transistor 101 receives the first driving signal PXID. The drain of the pull-up transistor 101 is connected to the sub word-line and the first end or the second end of the holding transistor 103. The gate of the pull-down transistor 102 is connected to the main word line. The drain of the pull-down transistor 102 is connected to the drain of the pull-up transistor 101. The source of the pull-down transistor 102 receives the third driving signal VKK. The sub word-line driver 100 is configured to provide, in response to the first driving signal PXID and the enable signal, a first driving signal PXID to a selected sub word-line which is a sub word-line connected to a first end or a second end of the holding transistor 103, and to conduct, in response to the first driving signal PXID, the enable signal, and the second driving signal PXIB, the first end and the second end of the holding transistor 103.

That is, the two main word lines may share the same holding transistor 103, and the word line driver conducts the first end and second end of the holding transistor 103 in response to the first driving signal PXID, the enable signal, and the second driving signal PXIB, so that the level of the selected sub word-line is pulled to be coincided with the level of the unselected sub word-line to close the selected word line. That is, when the sub word-line connected to one end of the holding transistor 103 is driven, the holding transistor 103 may cause the sub word-line connected to the other end of the holding transistor 103 to be in an unselected state, thereby decreasing the area occupied by the word line driving circuit and decreasing the layout area of the word line driving circuit under a condition of keeping the performance of the word line driving circuit unchanged.

Since a sub word-line driver 100 is connected to a sub word-line, and a holding transistor 103 is connected to two different sub word-lines respectively, in the word line driving circuit, the number of sub word-line drivers 100 is twice the number of holding transistors 103. That is, two sub word-lines connected to a holding transistor 103 are also connected to two sub word-line drivers 100, respectively.

It should be noted that in the word line driving circuit, when one of the word line drivers drives the sub word-line connected thereto, the sub word-lines connected to the remaining sub word-line drivers 100 are all in an unselected state. That is, only one sub word-line may be selected at a same moment in the word line driving circuit. Therefore, when the sub word-line connected to one of the first end or the second end of the holding transistor 103 is selected, the sub word-line connected to the other of the first end or the second end of the holding transistor 103 is in an unselected state. Thus, when the first end and the second end of the holding transistor 103 are conductive, the level of the sub word-line connected to the first end of the holding transistor 103 is pulled to be coincided with the level of the sub word-line connected to the second end of the holding transistor 103, so that the level of the selected sub word-line is pulled down to be coincided with the level of the unselected sub word-line, and the selected sub word-line is in a closed state.

The pull-up transistor 101 pulls up the sub word-line to the level of the first driving signal PXID in response to the enable signal and the first driving signal PXID, and the sub word-line is driven in response to the first driving signal PXID. The pull-down transistor 102 pulls down the sub word-line to the level of the third driving signal VKK in response to the enable signal, and the sub word-line is closed in response to the third driving signal VKK. In some embodiments, the first driving signal PXID may be at a high level and the third driving signal VKK may be at a low level. For example, the voltage of the third driving signal VKK may be 0 or less than 0.

The pull-up transistor 101 includes a PMOS transistor. The pull-down transistor 102 includes an NMOS transistor. The holding transistor 103 includes an NMOS transistor. That is, the pull-up transistor 101 is conductive in response to a low-level signal, and the pull-down transistor 102 is conductive in response to a high-level signal, so that the pull-up transistor 101 and the pull-down transistor 102 may not be interfered with each other, and may control the driving and closing of sub word-lines, respectively.

Specifically, when the pull-up transistor 101 is a PMOS transistor, the pull-down transistor 102 is an NMOS transistor, and the holding transistor 103 includes an NMOS transistor, the operation principle of the word line driving circuit is as follows.

Two sub word-line drivers 100 are designated as a first sub word-line driver and a second sub word-line driver, respectively, a sub word-line connected to the first end of the holding transistor 103 is designated as a first sub word-line, and a sub word-line connected to the second end of the holding transistor 103 is designated as a second sub word-line. The first sub word-line is connected to the first sub word-line driver and the second sub word-line is connected to the second sub word-line driver.

The first sub word-line driver drives the first sub word-line, and at this time, the second sub word-line is in an unselected state.

The first sub word-line driver drives the first sub word-line in response to an enable signal of a low level, a first driving signal PXID of a high level, and a second driving signal PXIB of a low level. Specifically, the pull-up transistor 101 is conductive in response to an enable signal of a low level, the first driving signal PXID of the high level is transmitted from the source of the pull-up transistor 101 to the drain of the pull-up transistor 101. At the same time, the holding transistor 103 is closed in response to the second driving signal PXIB of the low level, so that the level of the first sub word-line is pulled up to the first driving signal PXID and has a high level, thereby the first sub word-line is driven.

The first sub word-line driver closes the first sub word-line in response to an enable signal of a high level, a first driving signal PXID of a low level, and a second driving signal PXIB of a high level. The pull-down transistor 102 is conductive in response to an enable signal of a high level, and the pull-up transistor 101 is closed in response to an enable signal of a low level. A third driving signal VKK is transmitted from the source of the pull-down transistor 102 to the drain of the pull-down transistor 102, so that the level of the first sub word-line is pulled down to the third driving signal VKK, and the first sub word-line has a low level. At the same time, the holding transistor 103 is conductive in response to the second driving signal PXIB of the high level, so that the level of the first sub word-line coincides with the level of the second sub word-line. Since the second sub word-line is in the unselected state, it is ensured that the first sub word-line is closed and thus the first sub word-line becomes the unselected state.

The principle of the second sub word-line driver driving the second sub word-line and closing the sub word-line is the same as that of the first sub word-line driver, and will not be described in detail below. It should be noted that since the first sub word-line driver and the second sub word-line driver correspond to the same holding transistor 103, when the selected second sub word-line is needed to be closed, the level of the second sub word-line may be pulled down to the level of the first sub word-line by conducting the first end and the second end of the holding transistor 103, so that the second sub word-line is closed. That is to say, a holding transistor 103 may be set to connect to two different sub word-lines to control the closing of the two sub word-lines.

It should be understood that since the enable signal or the third driving signal VKK may have a problem of instability, or since the word line driving circuit may be disturbed by external noise, the level of the sub word-line may not be less than 0. The sub word-line may not be completely closed only by the third driving signal VKK. In the embodiments of the present disclosure, since the first end and the second end of the holding transistor 103 are set to be connected to two different sub word-lines, when the first end and the second end of the holding transistor 103 are conductive, the voltage of the selected word line will be pulled down to be coincided with the voltage of the unselected word line. That is, the voltage of the selected word line may be coupled to the level of the negative voltage by the holding transistor 103, so that the selected word line is closed. Therefore, no matter how the level of the enable signal or of the third driving signal VKK changes, the unselected word line may keep a stable voltage value.

It should be understood that, since the first sub word-line driver and the second sub word-line driver are respectively connected to different main word lines, the first word line driver and the second word line driver may respectively drive the connected sub word-lines in response to an enable signal from the first main word line and an enable signal from the second main word line, respectively.

With continued reference to FIG. 3, in some embodiments, the number of first channel areas covered by a first gate 130 may be four, and each of first channel areas is respectively located in different first active areas 110. That is, the first gate 130 spans four first active areas 110 arranged at intervals. The number of second channel areas 15 covered by the first gate 130 may be four, and each of second channel areas 15 is respectively located in different second active areas 120, so that the first gate 130 spans four second active areas 120 arranged at intervals. In the word line driving circuit formed in such a way, referring to FIG. 2, the number of pull-up transistors connected to the same main word line is four, and the number of pull-down transistors connected to the same main word line is four. That is to say, each main word line is connected to four sub word-line drivers 100, and the two sub word-line drivers 100 corresponding to the two main word lines may share the same holding transistor. That is to say, eight sub word-lines may be driven by two main word lines, and only four holding transistors are needed, so that the number of holding transistors in the word line driver may be decreased, and the layout area of the word line driving circuit is smaller.

Figure 9:
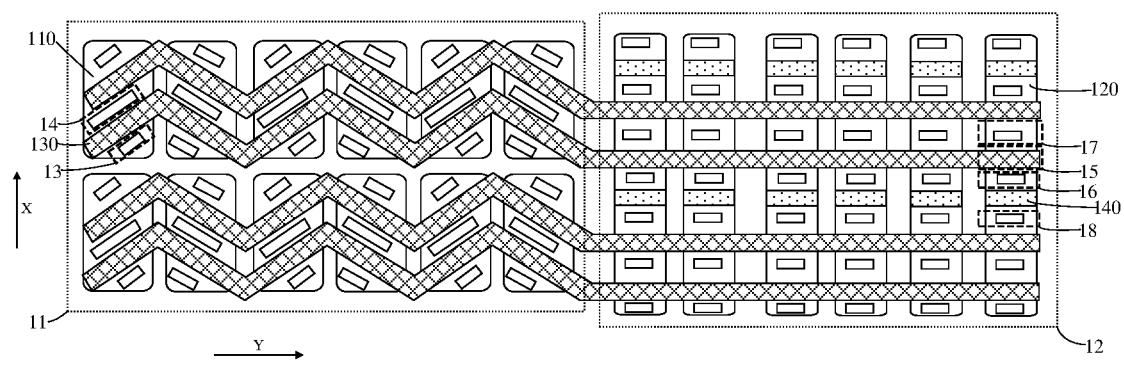
FIG. 9 is a schematic diagram of a layout structure of a sixth word line driver provided by the embodiments of the present disclosure.

Referring to FIG. 9, in other embodiments, the number of first channel areas covered by the first gate 130 may also be six. That is, the first gate 130 spans six first active areas 110 arranged at intervals. The number of the second channel areas 15 covered by the first gate 130 may be six. That is, the first gate 130 spans six second active areas 120 arranged at intervals.

In the word line driving circuit formed in such a way, the number of pull-up transistors connected to a same main word line is six, and the number of pull-down transistors connected to the same main word line is six. That is to say, each main word line is connected to six sub word-line drivers 100 and the two main word lines may drive a total of twelve sub word-lines. It should be understood that in the embodiments of the present disclosure, the number of the first active areas 110 may be flexibly set, so that the number of the first channel areas covered by the first gate 130 is different, thereby changing the number of sub word-lines that a main word line may drive.

In other embodiments, a second drain area 16 of a pull-down transistor corresponding to a first gate 130 and a third drain area of the holding transistor are shared, and a second drain area 16 of the other pull-down transistor corresponding to the same first gate 130 and a third source area 18 of the same holding transistor are shared. That is, two pull-down transistors corresponding to the same first gate 130 share a same holding transistor, and the same holding transistor is used to control two different sub word-lines corresponding to the same main word line, so that the numbers of the third source areas 18 and the third drain areas in the second active area 120 may be decreased, the size of the second active area 120 may be greatly decreased, and the layout area of the word line driver may be decreased under a condition of keeping the controlling ability of the word line driver unchanged.

Specifically, referring to FIG. 7, in some embodiments, the third channel area is located on one side of the second source area 17 or the second drain area 16 along the second direction Y. A third drain area of a holding transistor and a second drain area 16 of a pull-down transistor are shared, and a third source area 18 of the holding transistor and a second drain area 16 of the other pull-down transistor are shared. The second active area 120 includes a plurality of second source areas 17 and a plurality of second drain areas 16. The plurality of second source areas 17 are arranged at intervals in the second direction Y, and the plurality of second drain areas 16 are arranged at intervals in the second direction Y. The third channel area is located between the second drain areas 16 of two different pull-down transistors, such that the third channel area and the second drain areas 16 on two sides of the third channel area are located on a same side of the first gate 130 along the first direction X. The second drain area 16 on one side of the third channel area and the first gate 130 are used to form a pull-down transistor, and the second drain area 16 on the other side of the third channel area and the same first gate 130 are used to form another pull-down transistor. That is to say, two pull-down transistors connected to the same holding transistor correspond to the same first gate 130. That is, one holding transistor is used to control sub word-lines corresponding to the same main word line. The source and drain of the holding transistor and the drains of two different pull-down transistors are set to be shared, thereby decreasing the occupied area of the second active area 120, and improving the integration level of the word line driver.

Figure 10:
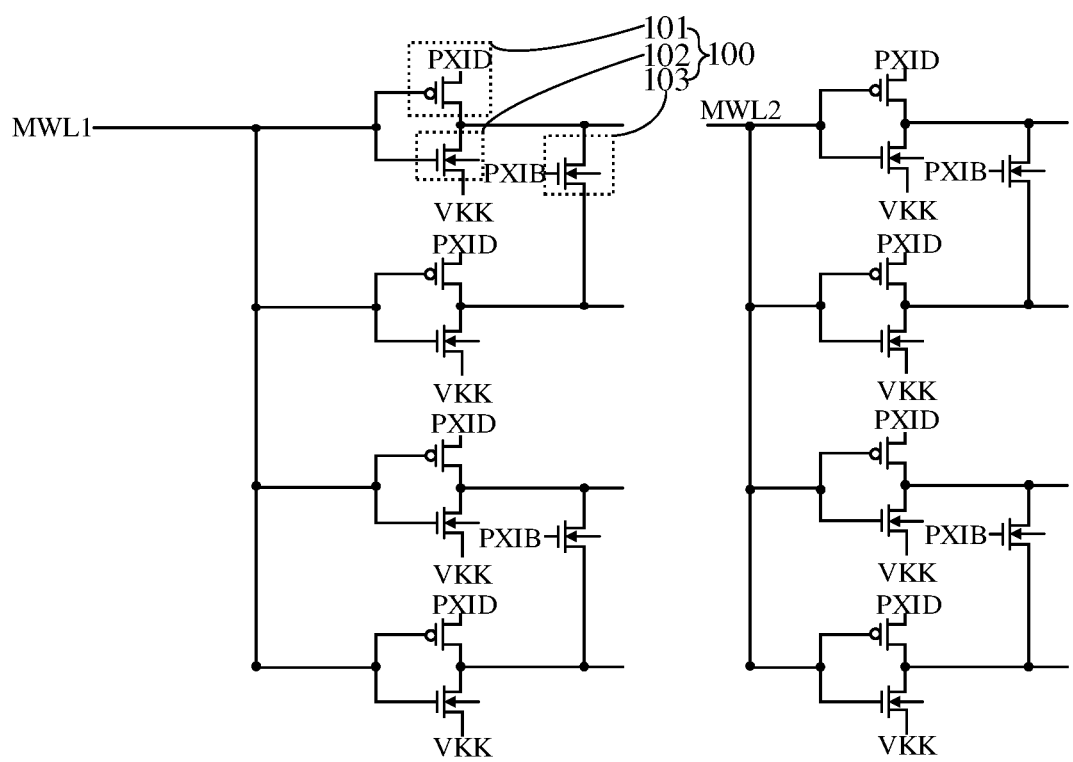
FIG. 10 is a schematic diagram of a circuit structure corresponding to the fifth word line driver provided by the embodiments of the present disclosure.

Specifically, the reference of the word line driving circuit corresponding to the word line driver in FIG. 7 is made to FIG. 10. The word line driving circuit includes at least two sub word-line drivers 100, and each sub word-line driver 100 is connected to a main word line and a sub word-line. The first end and the second end of the holding transistor 103 are respectively connected to different sub word-lines, and two sub word-lines connected to the first end and the second end of the holding transistor 103 correspond to the same main word line. That is, two sub word-line drivers 100 correspond to the same main word line. The gate of the pull-up transistor 101 is connected to the main word line, the gate of the pull-down transistor 102 is connected to the main word line, and the drain of the pull-down transistor 102 is connected to the drain of the pull-up transistor 101.

The operation principle of the word line driving circuit in FIG. 10 for driving and closing the sub word-line is the same as that of the word line driving circuit in FIG. 8, and will not be described hereafter. It should be understood that, since the two sub word-line drivers 100 are connected to the same main word line, when the main word line inputs an enable signal, the gates of the two pull-up transistors corresponding to the two sub word-line drivers 100 will simultaneously receive the enable signal from the main word line. Considering that only one sub word-line may be driven, the level of the first driving signal PXID received by the source of the pull-up transistor 101 of one sub word-line driver 100 may be set to be different from the level of the first driving signal PXID received by the source of the pull-up transistor 101 of the other sub word-line driver 100, so as to prevent two sub word-lines from being conductive at the same time.

With continued reference to FIG. 7, in some embodiments, when two pull-down transistors corresponding to the same first gate 130 share a same holding transistor, the number of first channel areas covered by the first gate 130 may be four, and each of first channel areas is respectively located in different first active areas 110. That is, the first gate 130 spans four first active areas 110 arranged at intervals. The number of second channel areas 15 covered by the first gate 130 may be four. The first gate 130 covers two second channel areas 15 in the first NMOS area 31 and two second channel areas 15 in the second NMOS areas 32, and each of second channel areas 15 is respectively located in different second active areas 120, so that the first gate 130 spans four second active areas 120. In the word line driving circuit formed in such a way, referring to FIG. 11, the number of pull-up transistors connected to a same main word line is four, and the number of pull-down transistors connected to the same main word line is 4. That is, each main word line is respectively connected to four sub word-line drivers 100. Two sub word-line drivers 100 corresponding to the same main word line share the same holding transistor. That is, one main word line corresponds to two holding transistors.

Figure 11:
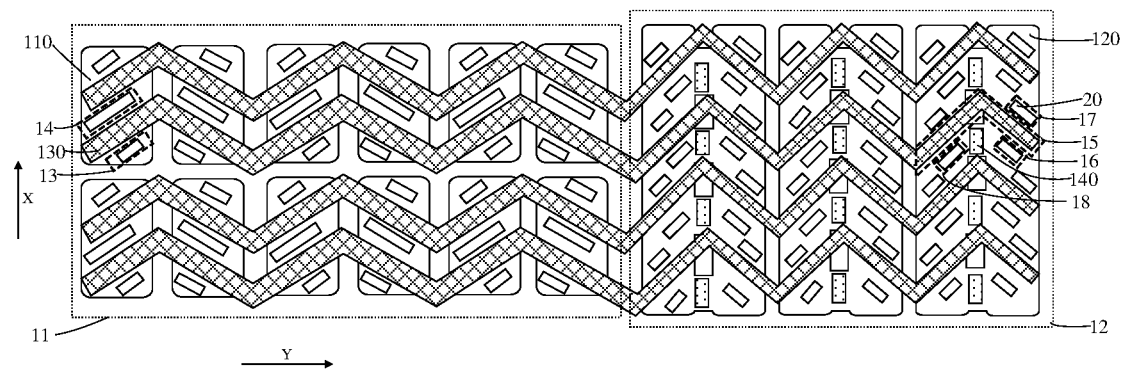
FIG. 11 is a schematic diagram of a layout structure of a seventh word line driver provided by the embodiments of the present disclosure.

Referring to FIG. 11, in other embodiments, the number of first channel areas covered by the first gate 130 may also be six. That is, the first gate 130 spans six first active areas 110 arranged at intervals. The number of the second channel areas 15 covered by the first gate 130 may be six. That is, the first gate 130 spans six second active areas 120 arranged at intervals. In the word line driving circuit formed in such a way, the number of pull-up transistors connected to a same main word line is six, and the number of pull-down transistors connected to the same main word line is six. That is, each main word line is connected to six sub word-line drivers 100. Two sub word-line drivers 100 corresponding to the same main word line share a same holding transistor. That is, one main word line corresponds to three holding transistors.

In some embodiments, the holding transistor includes a first transistor (not shown in the figures) and a second transistor (not shown in the figures). Two pull-down transistors electrically connected to a same first transistor share a first gate 130. For a same second transistor, a third drain area is electrically connected to a second drain area 16 of a pull-down transistor, a third source area 18 is electrically connected to a second drain area 16 of another pull-down transistor, and two pull-down transistors electrically connected to a same second transistor correspond to two first gates 130. That is to say, two pull-down transistors electrically connected to the first transistor correspond to a same main word line, so that the first transistor controls two sub word-lines corresponding to the same main word line. Two pull-down transistors electrically connected to a same second transistor correspond to the two first gates 130, respectively. That is, the two pull-down transistors electrically connected to the second transistor correspond to two different main word lines, so that the second transistor may control two different main word lines. That is, the connection between the holding transistor and different sub word-lines may be flexibly set, so that the area occupied by the word line driving circuit may be decreased under the condition of keeping the performance of the word line driving circuit unchanged, thus decreasing the layout area of the word line driving circuit.

In some embodiments, the NMOS area 12 includes a first NMOS area and a second NMOS area respectively located on opposite sides of the PMOS area 11. The first transistor is located in the first NMOS area. The second transistor is located in the second NMOS area. A part number of pull-down transistors is located in the first NMOS area, and the remaining number of pull-down transistors is located in the second NMOS area. Since the two pull-down transistors electrically connected to the first transistor share the first gate 130, the two pull-down transistors electrically connected to the same second transistor correspond to the two first gates 130, respectively, so that the connection mode between the first transistor and the first gate 130 and the connection mode between the second transistor and the first gate 130 are different. Therefore, the first transistor is set in the first NMOS area and the second transistor is set in the second NMOS area, which is beneficial to forming the first transistor and the second transistor respectively and simplifying the complexity of layout design. In addition, a pull-down transistor electrically connected to the first transistor is set in the first NMOS area, the pull-down transistor electrically connected to the second transistor is set in the second NMOS area, so that when the pull-down transistor is electrically connected to the first transistor and the second transistor, respectively, it is beneficial to shorten the line length of the metal layer, thereby reducing the signal delay in the metal layer.

In some embodiments, each first gate 130 includes at least two extension portions arranged at intervals along a first direction X and a connecting portion. Each extension portion covers a plurality of first channel areas and a plurality of second channel areas 15, and the each extension portion is inclined compared with the first direction X. The connecting part is connected to the extension portions arranged adjacent to each other in the first direction. The two extension portions cover the plurality of first channel areas and the plurality of second channel areas 15, so that one first gate 130 is electrically connected to the plurality of first channel areas and the plurality of second channel areas 15, and is used for controlling the plurality of pull-up transistors and conduction of the pull-down transistors. The connecting portion connects the extension portions arranged adjacent to each other in the first direction X, so that the two extension portions arranged at intervals are electrically connected to form a main word line for controlling the conduction of a plurality of pull-up transistors and a plurality of pull-down transistor, so that the number of sub word-lines that may be controlled by one main word line is increased. Specifically, when the number of the first channel areas covered by one extension portion is four and the number of the second channel areas 15 covered by one extension portion is four, four sub word-lines may be controlled. When the connecting portion connects the two extension portions to form a first gate 130, since each extension portion may control four sub word-lines, the first gate 130 may control eight sub word-lines.

In some embodiments, the material of the first gate 130 may include at least one of polysilicon or metal.

In some embodiments, each first gate 130 covers 4×N first channel areas and 4×N second channel areas 15. The pull-up transistors and pull-down transistors composed of each first gate 130 are electrically connected to 2×N holding transistors. N is a positive integer greater than or equal to 1. That is, the number of the first channel areas and the number of the second channel areas 1515 remain equal, so that the number of pull-up transistors and the number of pull-down transistors are the same, and each pull-up transistor and a pull-down transistor 102 constitute a sub word-line driver 100. The number of holding transistors is half of the number of pull-up transistors or pull-down transistors 102, so that the two sub word-line drivers 100 may share one holding transistor, thereby facilitating to decrease the number of holding transistors in the word line driver, and decreasing the layout area of the word line driver.

In the word line driver provided by the above-described embodiments, the pull-up transistor and the pull-down transistor may respectively transmit a driving signal to the sub word-line through the first drain area 13 and the second drain area 16, thereby controlling the driving and closing of the sub word-line. A third drain area and a third source area 18 of the holding transistor are electrically connected to second drain areas 16 of two different pull-down transistors, so that two pull-down transistors share the same holding transistor. Thus, when one sub word-line connected to one of the pull-down transistors is driven, the holding transistor may control the sub word-line connected to the other pull-down transistor to be in an unselected state, thereby decreasing the layout area of the word line driver under a condition of keeping the performance of the word line driver unchanged. In addition, the extension direction of the first gate 130 corresponding to the first active area 110 is set to be inclined compared with the extension direction of the first active area 110, so that the first gate 130 in the first active area 110 has a greater size, which is equivalent to increasing the channel size of the pull-up transistor, thereby improving the driving ability of the first gate 130 to the pull-up transistor.

Accordingly, the embodiments of the present disclosure also provide a memory device. The memory device includes a memory cell array including a plurality of memory cells connected to a plurality of sub word-lines and a plurality of bit lines, and a word line driving circuit provided by any of the above embodiments or a word line driver provided by any of the above embodiments. In some embodiments, the memory cell may be a DRAM memory cell.

Those of ordinary skill in the art should understand that the above-described embodiments are specific embodiments implementing the present disclosure, and in practical application, various changes in form and detail may be made thereto without departing from the spirit and scope of the present disclosure. Any person skilled in the art may make their own changes and modifications without departing from the spirit and scope of the present disclosure, so the scope of protection of the present disclosure shall be subject to the scope defined by the claims.

What is claimed is:

1. A word line driver comprising:
a substrate comprising an NMOS (N-Metal-Oxide-Semiconductor) area and a PMOS (P-Metal-Oxide-Semiconductor) area;
wherein the PMOS area comprises a plurality of first active areas extending along a first direction, and each first active area comprises a first channel area, and a first source area and a first drain area respectively located on opposite sides of the first channel area,
wherein the NMOS area and the PMOS area are arranged along a second direction, the NMOS area comprises a plurality of second active areas extending along the first direction, each second active area comprises a second channel area, and a second source area and a second drain area respectively located on opposite sides of the second channel area, and the each second active area further comprises a third channel area, and a third source area and a third drain area respectively located on opposite sides of the third channel area;
first gates, wherein the first gates are electrically connected to a main word line, one of the first gates, a first source area and a first drain area constitute a pull-up transistor, the one of the first gates, a second source area and a second drain area constitute a pull-down transistor, the pull-up transistor and the pull-down transistor are electrically connected to a same sub word-line, and an extension direction of first gates corresponding to a first active area are inclined compared with the first direction; and
a plurality of second gates, wherein each second gate covers a corresponding third channel area, and a second gate, a third source area and a third drain area constitute a holding transistor,
wherein, for a same holding transistor, a third drain area is electrically connected to a second drain area of a pull-down transistor and a third source area is electrically connected to a second drain area of another pull-down transistor.

2. The word line driver of claim 1, wherein each first gate extends along the second direction and covers a plurality of first channel areas and a plurality of second channel areas, and a first drain area of a pull-up transistor is electrically connected to a second drain area of a pull-down transistor, and is electrically connected to a corresponding sub word-line.

3. The word line driver of claim 1, wherein the PMOS area is located on one side of the NMOS area.

4. The word line driver of claim 1, wherein the NMOS area comprises a first NMOS area and a second NMOS area respectively located on opposite sides of the PMOS area.

5. The word line driver of claim 4, wherein the third channel area is located on one side of the second source area or second drain area along the second direction, and the third drain area of the holding transistor and a second drain area of a pull-down transistor are shared, and the third source area of the holding transistor and a second drain area of another pull-down transistor are shared.

6. The word line driver of claim 1, further comprising first contact structures, wherein each first contact structure is electrically connected to a first source area or a first drain area, and extension directions of orthographic projections, of at least a partial number of the first contact structures, on a surface of the substrate are inclined compared with the first direction.

7. The word line driver of claim 6, wherein an orthographic projection, of a first contact structure near an edge of a first active area, on the surface of substrate is triangular, and an extension direction of an orthographic projection, of a boundary of the first contact structure, on the substrate surface is inclined compared with the first direction, wherein the boundary towards a first gate.

8. The word line driver of claim 1, wherein an extension direction of first gates corresponding to a second active area is inclined compared with the first direction.

9. The word line driver of claim 8, wherein a length of one of the plurality of second active areas is greater than a length of one of the plurality of first active areas in the first direction, an inclined angle between an extending direction of the first gates corresponding to the one of the plurality of second active areas and the first direction is a first angle, an inclined angle between an extending direction of first gates corresponding to the one of the plurality of first active areas and the first direction is a second angle, and the first angle is less than the second angle.

10. The word line driver of claim 8, further comprising second contact structures, wherein each second contact structure is used to electrically connect to a second source area, a second drain area, and a third source area or third drain area, and an extension direction of an orthographic projection, of the second contact structure, on a surface of the substrate is inclined compared with the first direction.

11. The word line driver of claim 10, wherein a partial area of the orthographic projection, of the second contact structure, on the surface of the substrate is located outside of a second active area.

12. The word line driver of claim 1, further comprising third contact structures, wherein each third contact structure is used to electrically connect to adjacent second active areas.

13. The word line driver of claim 1, wherein a second drain area of a pull-down transistor corresponding a first gate and a third drain area of the holding transistor are shared, and a second drain area of another pull-down transistor corresponding the same first gate and a third source area of the same holding transistor are shared.

14. The word line driver of claim 1, wherein a second drain area of a pull-down transistor corresponding to a first gate and a third drain area of the holding transistor are shared, and a second drain area of a pull-down transistor corresponding to another first gate and a third source area of the same holding transistor are shared.

15. The word line driver of claim 14, wherein a second gate is located between adjacent first gates.

16. The word line driver of claim 1, wherein the holding transistor comprises: a first transistor and a second transistor, two pull-down transistors electrically connected to a same first transistor share a first gate, for a same second transistor, a third drain area is electrically connected to a second drain area of a pull-down transistor and a third source area is electrically connected to a second drain area of another pull-down transistor, and two pull-down transistors electrically connected to a same second transistor correspond to two first gates.

17. The word line driver of claim 16, wherein the NMOS area comprises:

a first NMOS area and a second NMOS area that are respectively located at opposite sides of the PMOS area, wherein the first transistor is located in the first NMOS area, the second transistor is located in the second NMOS area, a part number of pull-down transistors are located in the first NMOS area, and a remaining number of the pull-down transistors are located in the second NMOS area.

18. The word line driver of claim 1, wherein each first gate comprises:

at least two extension portions arranged at intervals along the first direction, wherein each extension portion covers a plurality of first channel areas and a plurality of second channel areas, and is inclined compared with the first direction; and a connecting portion, wherein the connecting portion connects extension portions arranged adjacent to each other in the first direction.

19. The word line driver of claim 1, wherein a first gate covers 4×N first channel areas and 4×N second channel areas, and pull-up transistors and pull-down transistors composed of each first gate are electrically connected to 2×N holding transistors, wherein N is a positive integer greater than or equal to 1.

20. A memory device comprising:

a memory cell array comprising a plurality of memory cells connected to a plurality of sub word-lines and a plurality of bit lines; and a word line driver comprising:

a substrate comprising an NMOS (N-Metal-Oxide-Semiconductor) area and a PMOS (P-Metal-Oxide-Semiconductor) area;

wherein the PMOS area comprises a plurality of first active areas extending along a first direction, and each first active area comprises a first channel area, and a first source area and a first drain area respectively located on opposite sides of the first channel area, wherein the NMOS area and the PMOS area are arranged along a second direction, the NMOS area comprises a plurality of second active areas extending along the first direction, each second active area comprises a second channel area, and a second source area and a second drain area respectively located on opposite sides of the second channel area, and the each second active area further comprises a third channel area, and a third source area and a third drain area respectively located on opposite sides of the third channel area;

first gates, wherein the first gates are electrically connected to a main word line, one of the first gates, a first source area and a first drain area constitute a pull-up transistor, the one of the first gates, a second source area and a second drain area constitute a pull-down transistor, the pull-up transistor and the pull-down transistor are electrically connected to a same sub word-line, and an extension direction of first gates corresponding to a first active area are inclined compared with the first direction; and a plurality of second gates, wherein each second gate covers a corresponding third channel area, and a second gate, a third source area and a third drain area constitute a holding transistor, wherein, for a same holding transistor, a third drain area is electrically connected to a second drain area of a pull-down transistor and a third source area is electrically connected to a second drain area of another pull-down transistor.

* * * * *